US005511296A

United States Patent [19]

Dias et al.

[11] Patent Number: 5,511,296

[45] Date of Patent: Apr. 30, 1996

[54] METHOD FOR MAKING INTEGRATED MATCHING LAYER FOR ULTRASONIC TRANSDUCERS

[75] Inventors: J. Fleming Dias; Mir S. Seyed-Bolorforosh, both of Palo Alto, Calif.

[73] Assignee: Hewlett Packard Company, Palo Alto, Calif.

[21] Appl. No.: 225,127

[22] Filed: Apr. 8, 1994

[51] Int. Cl.$^6$ .................................................... H01L 41/22

[52] U.S. Cl. .......................... 29/25.35; 310/334; 467/100

[58] Field of Search .......................... 29/25.35; 427/100; 310/330–337

[56] References Cited

U.S. PATENT DOCUMENTS

| | | | |
|---|---|---|---|
| 4,939,826 | 7/1990 | Shoup | 29/25.35 |
| 5,327,895 | 7/1994 | Hashimoto et al. | 29/25.35 X |

OTHER PUBLICATIONS

Haller, M. I., et al., "Micromachined Ultrasonic Materials," *IEEE 1991 Ultrasonics Symposium*, pp. 403–405.

Oakley, Clyde et al., "Development of 1–3 Ceramic–Air Composite Transducers", SPIE, vol. 1733, 1992, pp. 274–283.

Smith, Wallace Arden, "New Opportunities in Ultrasonic Transducers Emerging from Innovations in Piezoelectric Materials," SPIE, vol. 1733, 1992, pp. 3–26.

Vogel, R. F., et al., "Transducers with Screen Printed Matching Layers," Electrical and Computer Engineering Department, University of Iowa, Iowa City, Iowa.

*Primary Examiner*—Carl E. Hall

[57] ABSTRACT

A method of forming an impedance matching layer of an acoustic transducer includes geometrically patterning impedance matching material directly onto a radiating surface of piezoelectric substrate. In one embodiment, the matching layer is deposited onto the piezoelectric substrate and photolithographic techniques are utilized to pattern the matching layer to provide posts tailored to better match the piezoelectric substrate to a medium into which acoustic waves are to be transmitted. A nominal layer of metal between the posts and the piezoelectric substrate improves the attachment of the matching material to the substrate. The nominal layer may be chrome-gold and the matching material may be copper. Typically, the radiating surface is the substrate front surface from which acoustic waves are directed into a medium of interest, e.g., water or human tissue. However, the radiating surface may be the substitute rear surface, with the patterned matching layer providing acoustic matching to a backing layer for absorbing acoustic energy. In another embodiment, matching layers of different acoustic impedances are deposited and patterned on both the front and rear surfaces to provide matching for effective transmission into the medium of interest and into an acoustic absorptive backing medium.

17 Claims, 2 Drawing Sheets

METHOD FOR MAKING INTEGRATED MATCHING LAYER FOR ULTRASONIC TRANSDUCERS

TECHNICAL FIELD

The present invention relates to acoustic impedance matching layers formed between a piezoelectric transducer and a medium to which acoustic waves are to be transmitted and received.

BACKGROUND ART

Acoustic waves that encounter a change in acoustic impedance will be at least partially reflected. This presents a problem for efficient and wideband operation of a piezoelectric transducer, since the acoustic impedance of the transducer may differ from the acoustic impedance of the medium into which acoustic wave energy is to be transmitted. For example, the acoustic impedance of a piezoelectric substrate may differ from the acoustic impedance of a human body by a factor of twenty or more.

In order to improve acoustic transmission between piezoelectric transducers and the media through which wave energy is transmitted and received, acoustic impedance matching layers have been employed. Energy reflection can be reduced by utilizing a front matching layer having a thickness of one-quarter of the wavelength of the operating frequency of the piezoelectric substrate and having an acoustic impedance equal to the square root of the product of the acoustic impedances of the substrate and the medium. The efficiency of transmitting acoustic wave energy may be further enhanced by attaching a front matching layer having an acoustic impedance that gradually changes from that of the first piezoelectric substrate to that of the medium of interest, e.g. water or tissue.

A material with an acoustic impedance that is appropriate for a quarter-wavelength matching layer between a conventional transducer and a medium of interest is often not available or may be difficult to synthesize. Moreover, it is often difficult to form a matching layer substance having an acoustic impedance that varies gradually. Candidate materials having appropriate impedances for matching layers are typically not electrically conductive, presenting another problem since an electric field needs to be generated within the piezoelectric material. In addition, such matching layers typically need to be bonded to the transducer, and the selected bonding material may create a layer that tends to interfere with the acoustic pressure wave transmission, especially at ultrasonic frequencies.

Dicing a piezoelectric ceramic and filling the spaces between the diced ceramic with low acoustic impedance epoxy is another known approach to rèducing the acoustic impedance of a transducer. As long as the diced elements are small relative to the wavelength of the transmitted waves, the effective acoustic impedance of the transducer is reduced as a function of the volume fraction of the piezoelectric ceramic that is removed. The dicing technique is described in "New Opportunities in Ultrasonic Transducers Emerging from Innovations in Piezoelectric Materials," W. A. Smith, SPIE (Society of Photo-Optical Instrumentation Engineers), Volume 1733 (1992), pages 3–24. The dicing is typically performed by micromachining with fine circular saws. Consequently, there is a limit to the center-to-center distance between cuts. At high frequencies, e.g. 10 MHz, the distances are extremely small and the implementation of the technique is costly.

As an alternative to dicing the piezoelectric substrate, micromachining and then bonding a quarter-wavelength thick matching layer to achieve a desired matching layer acoustic impedance was disclosed by M. I. Haller and B. T. Khuri-Yakub in an article entitled "Micromachined Ultrasonic Materials," in *1991 IEEE Ultrasonics Symposium,* pages 403–405. In this technique, etching trenches or holes in silicon may be used to produce high aspect ratio fins or posts in a matching layer that is then bonded to a piezoelectric substrate. However, at high frequencies the layer of bonding material for attaching the matching layer to the piezoelectric substrate potentially interferes with acoustic wave transmission, since the thickness of the bond layer becomes comparable to the thickness of the matching layer.

The various techniques for achieving impedance matching are known, but there are difficulties when operating at high frequencies. The imposed limit may be a result of an unavailability of a suitable material or the result of a necessity of forming a very thin bonding layer that is acoustically transparent at the operating frequency. What is needed is a method of forming a piezoelectric transducer having an impedance matching layer for operation at high frequencies.

SUMMARY OF THE INVENTION

The invention provides a method of fabricating a transducer such that an integrated matching layer can be formed in a manner suitable for operation at high frequencies. The matching layer is patterned directly onto a piezoelectric substrate. That is, rather than forming a matching layer that is then attached to a piezoelectric substrate, the invention is one in which the bulk of the matching layer is deposited, whereafter patterning the matching layer material is performed onto the piezoelectric substrate.

In a preferred embodiment, thin film techniques are utilized to deposit and configure the matching layer. For example, a metal layer having a thickness of one-quarter wavelength of the operating frequency of the piezoelectric transducer may be formed on the transducer. A suitable metal is copper that is micro-electroplated onto the transducer. Depending upon the matching layer material, a nominal layer may need to be deposited prior to depositing the matching layer. A suitable nominal layer for the micro-electroplated copper is one having films of chrome and gold. The nominal layer is selected for adhesive characteristics in joining the matching layer material to the piezoelectric material. However, unlike bonding materials utilized in prior art techniques, the nominal layer should be one in which most or all of the material settles within the porous piezoelectric transducer.

Photolithographic techniques may be used to pattern the matching layer that is deposited according to the preferred embodiment. A coating of photoresist, which is deposited on the metal layer, may be exposed, developed and etched. Removing the unpolymerized photoresist leaves an array of posts on the surface of the piezoelectric transducer. The remaining photoresist is then removed. The acoustic impedance of the matching layer can be controlled by selecting the volume fraction of matching layer material that remains with respect to the volume fraction of the suitable filler material filling the spaces within the patterned matching layer. In one embodiment, the patterned matching layer is an array of cylindrical posts having a thickness of one quarter wavelength of the operating frequency of the transducer. However, a matching layer having an array of posts of other geometrical cross-sections, e.g., ovals, may be preferred for particular applications.

An electrode layer may then be formed on the surface of the composite matching layer. For example, a second nominal layer of Cr—Au may be deposited for coupling the transducer to a source of an excitation signal.

Other techniques for direct patterning of a matching layer on a piezoelectric transducer may be employed. Rather than photolithographic techniques, laser etching may be used to pattern the matching layer. Moreover, at low frequencies, the matching layer can be formed by silkscreening or injection molding the material onto the transducer to form the desired pattern. An electrically conductive face may be silkscreened onto the face of a piezoelectric substrate having a nominal metallization. A second nominal coating of chrome-gold may then be formed atop the device having the patterned conductive face. A dielectric material can also be used in forming matching layers. The dielectric matching material can be patterned by any of the techniques of the invention. An electrode layer may then be deposited onto the top and side surfaces of the dielectric matching layer. Furthermore, the matching layer may be made of quartz or a piezoelectric copolymer.

In one embodiment, the matching layer is deposited and patterned onto the front surface of the piezoelectric substrate, with the matching designed to provide efficient transmission into and from a medium of interest, e.g. water or human tissue. Optionally, a matching layer may be deposited and patterned on the rear surface of the piezoelectric transducer to achieve efficient transmission of acoustic waves into a backing medium for absorbing rearwardly directed acoustic waves.

An advantage of the present invention is that the patterning resolution afforded by photolithographic techniques or laser beam etching techniques permits patterning of the matching layer to tailor the acoustic impedance to achieve a desired result. Since an adhesive layer is not required to bond the matching layer to the piezoelectric substrate, efficient quarter-wavelength operation of matching layer is achieved without the influence of a bond layer. Another advantage of using the techniques is that multiple matching layers may be formed in order to optimize the transfer of acoustic energy.

BEST MODE FOR CARRYING OUT THE INVENTION

Figure 1:
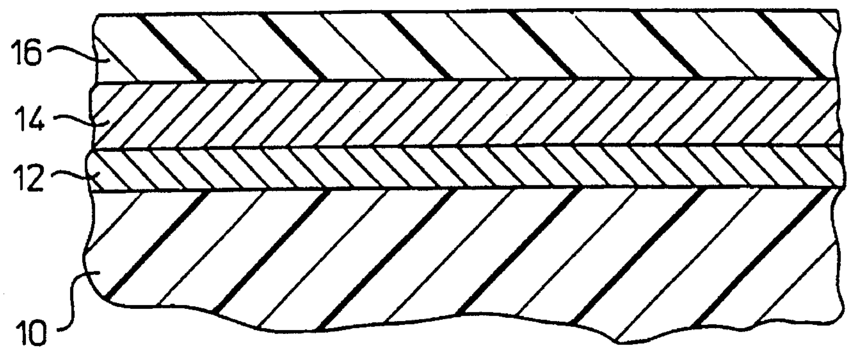
FIG. 1 is a side sectional view of a piezoelectric substrate having various layers formed on an upper surface in accordance with the invention.

With reference to FIG. 1, a piezoelectric substrate 10 is shown as having a number of layers formed atop the substrate. The piezoelectric substrate is a conventional piezoelectric material. The selection of material for forming the piezoelectric substrate to achieve a desired result is well understood by persons skilled in the art of designing a transducer device and is not critical to the invention. An acceptable material for forming the piezoelectric substrate

10 is lead zirconate titanate (PZT). The thickness of the piezoelectric layer determines the operating frequency of the transducer. As defined herein, the "transducer" is the structure that converts an electrical excitation signal into acoustic waves and/or converts acoustic waves into an electrical signal. The design of the piezoelectric substrate 10 is not critical to the invention. The structure shown in FIG. 1 may be one element of a two-dimensional array of piezoelectric elements of a device used in medical imaging.

The upper surface of the piezoelectric substrate 10 is a radiating surface for transmitting acoustic waves into a medium of interest. A nominal layer 12 is deposited on the radiating surface. The nominal layer is selected for its conductive and adhesive properties. An acceptable layer 12 is a first film of chrome having a thickness of approximately 100 Å and a second film of gold having a thickness of approximately 2000 Å. While the surface of the piezoelectric substrate is shown as being planar, a spherically shaped transducer can also be used, since PZT is a porous material that will receive most of the nominal layer.

A layer 14 of matching material is formed on the nominal layer 12. While not critical, the layer may be a high purity copper that is micro-electroplated onto the gold film of the nominal layer. The thickness of the matching layer is preferably one-quarter wavelength of the operating frequency of the piezoelectric transducer.

A photoresist 16 is then deposited on the layer of matching material 14. For example, the photoresist may be a conventional photo-negative resist. Standard techniques are employed to transfer a desired matching layer geometry to the photoresist. For example, a mask may be positioned to selectively expose portions of the photoresist to ultraviolet radiation. The photoresist is developed and an etchant is used to remove portions of the photoresist 16 and the layer 14 of matching material. The etchant may or may not be selective to etching the nominal layer 12 as well, but should not readily etch the piezoelectric substrate 10.

Figure 2:
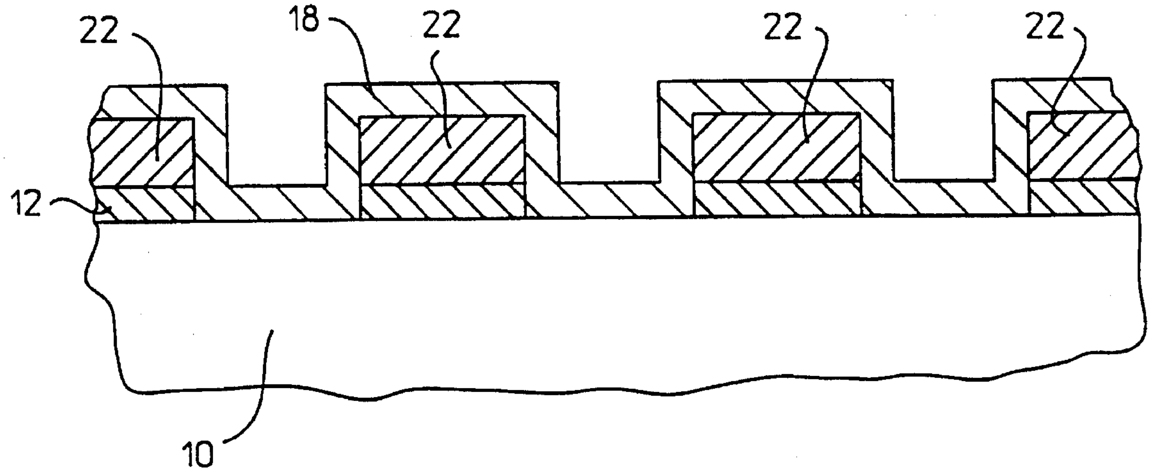
FIG. 2 is a side sectional view of the piezoelectric substrate of FIG. 1 having a patterned matching layer.

Referring now to FIG. 2, the nominal layer 12 is etched and an electrode layer 18 is then blanket deposited onto the patterned structure. A second electrode layer, not shown, is formed on the back surface of the piezoelectric substrate. A source of an excitation signal is connected to the two electrode layers to transmit and receive electrical signals to and from the substrate.

Figure 3:
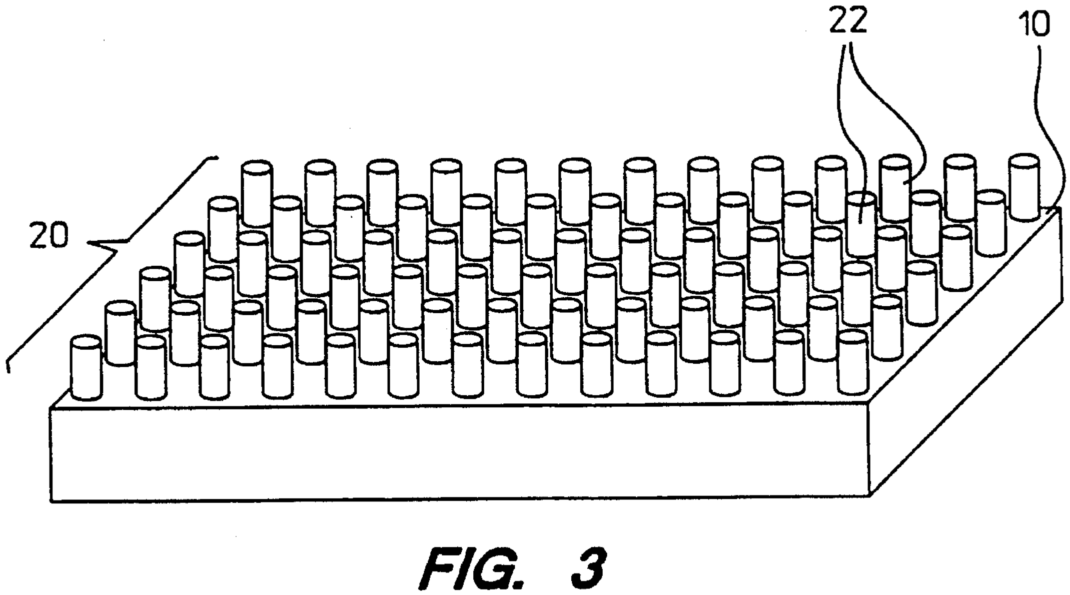
FIG. 3 is a perspective view of the substrate of FIG. 2.

In FIGS. 2 and 3, the patterned matching layer is shown as an array 20 of cylindrical posts 22. While not critical, the posts preferably have a thickness of one-quarter wavelength of the operating frequency of the transducer. The design of the cylindrical posts is dependent upon the media that is to be matched. The volume fraction of the filler material between the posts relative to the total volume of the posts and the spacing between the posts determines the acoustic impedance of the matching layer. In the above-cited reference of W. A. Smith in SPIE, Volume 1733 (1992), it is shown that by removing piezoelectric material from a bulk piezoelectric ceramic, the acoustic impedance of the bulk piezoelectric ceramic can be decreased with changes to the volume fraction of the remaining ceramic. For example, the bulk velocity of PZT-5 drops to approximately 80% of its original value for a 30% volume fraction of remaining PZT-5. Inferring from this result, the velocity of acoustic waves in a 30% volume fraction segmented copper matching layer is approximately 80% of the bulk velocity in copper, i.e. 5040 m/s×80% =4032 m/s. The optimal thickness of the matching layer for a piezoelectric transducer having a central frequency of 10 MHz is therefore $4032/(4\times10\times10^6)$, i.e. approximately 0.1 mm.

While the invention has been described with reference to a PZT substrate, the integration may also occur with lithium niobate, zinc oxide, a copolymer vinylidene fluoride with tetrafluorothylene P(VDF-TrFE), and crystalline quartz transducers. Particularly with lithium niobate, the techniques can be implemented directly by etching the desired matching layer pattern to a quarter-wavelength depth using integrated circuit techniques.

In another example, a lead metaniobate transducer having an acoustic impedance of approximately 17 MRayls has a radiating surface on which an aluminum matching layer is patterned. A bulk aluminum matching layer has an impedance of approximately 17 MRayls and a bulk velocity of 6400 m/s. An improved impedance match to water may be obtained by patterning the bulk matching layer in a manner to provide an acoustic impedance of approximately 5.0 MRayls. This can be achieved with a low volume fraction of approximately 5% of aluminum. Using the inferences referred to above, at 5% the velocity through the patterned matching layer is approximately 60% of the bulk velocity of aluminum. That is, the velocity is approximately 3840 m/s. The thickness of the matching layer for a transducer having an operating frequency of 20 MHz is approximately $3840/(4\times20\times106)=1.9$ mils. The build-up to this thickness can be achieved by anodizing the face of the substrate.

At higher frequencies, such as 100 MHz, x-cut quartz may be used. The bulk velocity is 5740 m/s and the bulk acoustic impedance is 15.2 MRayls. An impedance match to water may be achieved by forming a segmented surface. The velocity of a segmented surface to achieve an acoustic impedance of approximately 4.8 MRayls is around $5740\times60\% = 3444$ m/s. The thickness of the matching layer will then be approximately 0.34 mils.

Another application would be one in which the copolymer vinylidene fluoride with tetrafluoroethylene P(VDF-TrFE) is to be used to transmit pulses into water. The bulk velocity of the copolymer is 2400 m/s and the acoustic impedance is 4.5 MRayls. An acceptable matching layer would have an impedance of 2.6 MRayls, which can be obtained by a sputter etching and plasma etching process along one surface of the copolymer sheet. Assuming a 50% volume fraction, at 100 MHz, the matching layer would have a thickness of approximately $(0.5\times2400\times10^3)/(4\times100\times106)=0.12$ mils. All of these calculations and the calculations set forth above are to be considered estimations.

In another embodiment, the radiating surface onto which the array 20 of posts 22 is formed is the rear surface of the piezoelectric substrate 10 of FIG. 3. That is, rather than patterning the matching layer for efficient acoustic transmission to and from a medium of interest, the matching layer can be designed for efficient transmission of acoustic energy into a backing medium for absorbing acoustic energy.

While the cylindrical posts 22 are shown as a single patterned layer, optionally impedance matching is achieved by forming successive films of different materials.

At lower frequencies, the segmented matching layer 20 of FIG. 3 may be obtained by silkscreening an electrically conductive paste onto a piezoelectric substrate, such as one made of PZT-4 or PZT-5H. Preferably, a metallic layer is applied to the piezoelectric substrate prior to the silkscreening process. Following the application of the conductive paste, a second metallization is formed. A preferred metallization is a nominal coating of chrome-gold. Injection molding is another alternative, but in the same manner as silkscreening, injection molding is limited to fabricating transducers to be operated at low frequencies.

A matching layer having a graded impedance that more closely matches the impedance of the piezoelectric transducer at one side and the impedance of the medium of interest at the opposite side may be formed. This can be accomplished by having a volume fraction of a high impedance material gradually decline with departure from the transducer and approach to the medium. For example, conical projections or pyramids can be formed.

Referring again to FIG. 2, the spaces between adjacent posts 22 may optionally be filled with a material such as epoxy. The epoxy fill does not affect the volume fraction of the matching material, but does add support for the posts.

Figure 4:
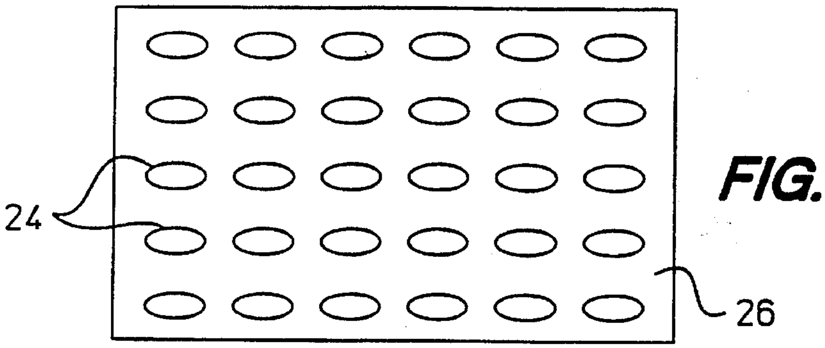
FIGS. 4–6 are top views of alternative embodiments of the invention.

Referring now to FIG. 4, a matching layer having a configuration of a distribution of elliptical posts 24 is shown. The elliptical posts are formed on a piezoelectric substrate 26, such as PZT. The matching material may be copper and a chrome-gold metallization is preferably included. The elliptical posts are asymmetrical in the basal plane of the piezoelectric substrate 26. While forming a matching layer of this type is problematic, such formations provide advantages to tailoring acoustic impedance and controlling the lateral modes of vibration.

Figure 5:
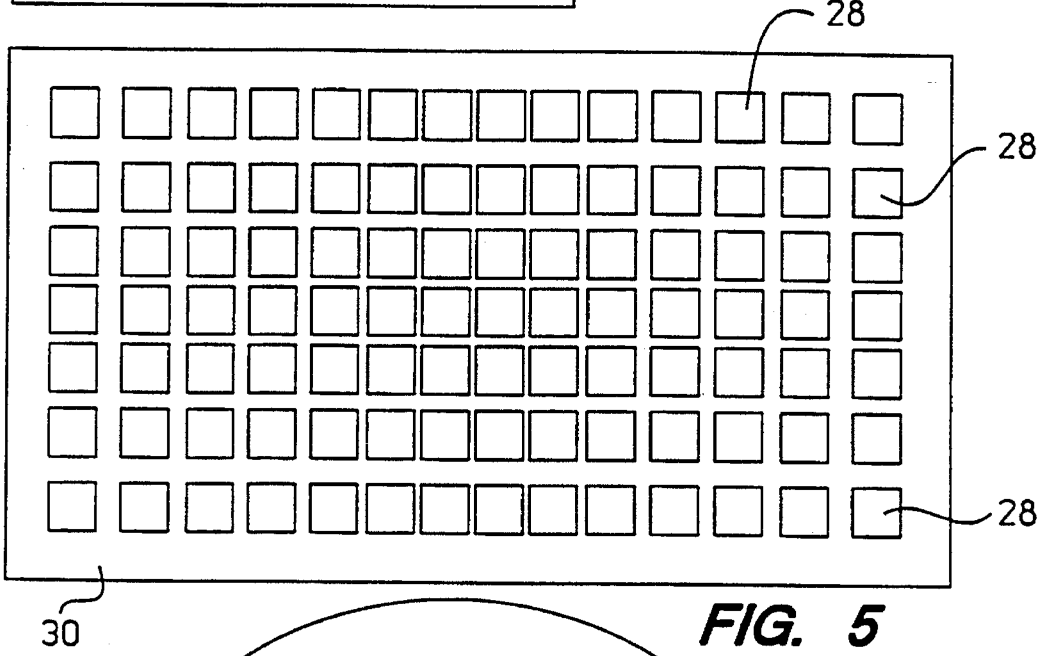

Referring now to FIG. 5, another distribution for a high volume fraction matching layer is shown. The distribution of four-sided posts 28 on a piezoelectric substrate 30 is one in which the posts vary in pitch with distance from the center of the substrate. The distribution may be Gaussian in the direction parallel to the longer substrate sides and half cosine in the direction parallel to the shorter sides of the substrate. An advantage of the embodiment of FIG. 5 is that the spatial difference of impedance matching achieved by varying the volume fraction of the matching material allows a greater center intensity of acoustic waves launched from the piezoelectric substrate. However, some spatial resolution is sacrificed.

Figure 6:
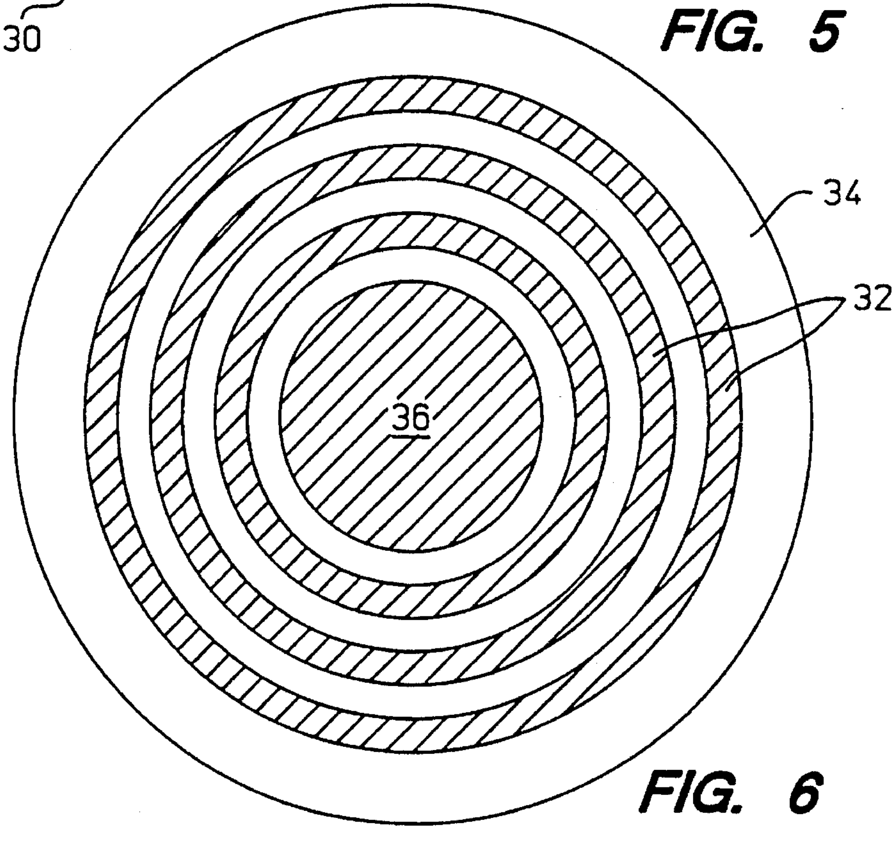

FIG. 6 shows another embodiment. In this embodiment, the matching layer includes an array of circular segments 32 on a piezoelectric substrate 34. Preferably, the segments have a prescribed variation in the radial direction. The wave coupling is assumed to be maximal at a solid center segment 36 of the ultrasonic device. The coupling is then reduced with approach to an outer periphery.

We claim:

1. A method of fabricating a transducer to enhance communication of acoustic waves with a medium comprising:

providing a piezoelectric member having a continuous piezoelectric radiating surface, and forming a patterned matching layer having a plurality of posts containing layer material onto said continuous piezoelectric radiating surface, including applying and geometrically patterning material onto said radiating surface and further including selecting said material and selecting a layer geometry of posts containing matching layer material on a continuous surface of the piezoelectric member to achieve a desired acoustic impedance for transmitting acoustic waves between said medium and said piezoelectric member.

2. The method of claim 1 wherein forming said patterned matching layer includes depositing said material onto said radiating surface in an unpatterned condition.

3. The method of claim 1 wherein geometrically patterning said material includes using photolithographic techniques to pattern at least one layer deposited atop said radiating surface.

4. The method of claim 1 further comprising forming a metal layer on said radiating surface before forming said patterned matching layer, said radiating surface being a forward surface of said piezoelectric member for communication of acoustic waves into a medium of interest.

5. The method of claim 1 wherein forming said patterned matching layer is carried out on a rear surface of said piezoelectric member for impedance matching to a backing medium for absorbing acoustic waves.

6. The method of claim 1 further comprising forming a second patterned matching layer on a surface of said piezoelectric member opposite to said radiating surface, wherein acoustic wave transmission is enhanced at each of forward and rearward surfaces of said piezoelectric member.

7. The method of claim 1 wherein forming said patterned matching layer is a step of geometrically patterning material to form posts extending from said radiating surface.

8. The method of claim 1 wherein forming said patterned matching layer includes limiting said layer to a fractional thickness of approximately one-quarter wavelength of an operating frequency of said piezoelectric member.

9. The method of claim 1 wherein forming said patterned matching layer includes one of laser beam etching, silk-screening and injection molding.

10. The method of claim 1 further comprising forming an electrode layer onto said patterned matching layer.

11. A method of forming an acoustic impedance matching layer for a piezoelectric transducer having a piezoelectric member with a continuous piezoelectric radiating surface comprising:

forming a material onto said continuous piezoelectric radiating surface, including selecting said material based upon the bulk acoustic impedance of a layer formed of said material; and selecting a layer geometry of posts containing said material on said continuous piezoelectric radiating surface to achieve a desired acoustic impedance for transmitting acoustic waves between a medium and said piezoelectric member, and patterning said material formed on said surface according to said geometry, including removing portions of said material to reduce a volume fraction of remaining material, leaving a patterned matching layer on said continuous piezoelectric radiating surface.

12. The method of claim 11 wherein patterning said material includes using photolithographic techniques of exposing and developing a photoresist deposited onto said material.

13. The method of claim 11 further comprising forming an electrode layer on said patterned matching layer.

14. The method of claim 11 wherein patterning said material includes forming an array of posts projecting from said surface of said piezoelectric transducer.

15. The method of claim 11 further comprising forming a metallic layer on said surface of said piezoelectric substrate prior to forming said material.

16. A method of fabricating a transducer to enhance communication of acoustic waves with a medium, comprising:

providing a piezoelectric member having a continuous piezoelectric radiating surface, selecting an acoustic impedance, selecting a layer geometry for a matching layer of a matching layer material that would result in the selected acoustic impedance when a matching layer of the layer geometry is formed on the continuous piezoelectric radiating surface, applying a patterned layer of the matching layer material on said continuous piezoelectric radiating surface to result in the layer geometry in the patterned layer by one of depositing a layer of the matching layer material followed by selectively removing part of the matching layer material and depositing matching layer material selectively on the continuous piezoelectric radiating surface to form the layer geometry, said patterned layer having a plurality of posts containing the matching layer material and being adapted for transmitting acoustic waves between said medium and said piezoelectric member, to result in the selected acoustic impedance in the patterned layer.

17. The method of claim 16 further comprising applying a second layer of matching layer material to form a second patterned matching layer according to a second selected layer geometry to achieve a desired acoustic impedance between that of the patterned matching layer on the continuous piezoelectric radiating surface of the piezoelectric member and that of the medium.

* * * * *